US009545043B1

(12) United States Patent
Hamilton et al.

(10) Patent No.: US 9,545,043 B1
(45) Date of Patent: Jan. 10, 2017

(54) SHIELDING ENCAPSULATION FOR ELECTRICAL CIRCUITRY

(75) Inventors: Brandon C. Hamilton, Marion, IA (US); Guy N. Smith, Cedar Rapids, IA (US); Alan P. Boone, Swisher, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 289 days.

(21) Appl. No.: 12/892,309

(22) Filed: Sep. 28, 2010

(51) Int. Cl.
*H05K 9/00* (2006.01)
*H05K 7/02* (2006.01)
*H05K 7/04* (2006.01)
*H01L 23/29* (2006.01)

(52) U.S. Cl.
CPC .......... *H05K 9/0081* (2013.01); *H05K 9/0083* (2013.01); *H01L 23/295* (2013.01); *H05K 9/009* (2013.01); *H05K 9/0024* (2013.01); *H05K 9/0088* (2013.01)

(58) Field of Classification Search
CPC .. H05K 9/0081; H05K 9/0083; H05K 9/0024; H05K 9/0088; H05K 9/009; H01L 23/295; H01L 2924/3025
USPC ................................ 174/358, 382, 388, 391
See application file for complete search history.

(56) References Cited

U.S. PATENT DOCUMENTS

| 4,959,752 | A | * | 9/1990 | Samarov et al. ............. 361/818 |
| 5,006,397 | A | * | 4/1991 | Durand ....................... 361/748 |
| 5,341,274 | A | * | 8/1994 | Nakatani et al. ............ 361/818 |
| 5,366,664 | A | * | 11/1994 | Varadan et al. .............. 428/364 |
| 5,459,368 | A | * | 10/1995 | Onishi et al. ............... 310/313 R |
| 5,561,265 | A | * | 10/1996 | Livshits et al. ............... 174/391 |
| 5,639,989 | A | * | 6/1997 | Higgins, III .................. 174/386 |
| 5,696,196 | A | * | 12/1997 | DiLeo .......................... 524/445 |
| 5,864,088 | A | * | 1/1999 | Sato et al. .................... 174/386 |
| 5,968,600 | A | * | 10/1999 | DiLeo ........................ 427/393.5 |
| 5,989,942 | A | * | 11/1999 | Ishikawa ................ H01L 23/24 257/E23.121 |
| 6,150,193 | A | * | 11/2000 | Glenn .......................... 438/113 |
| 6,261,680 | B1 | * | 7/2001 | Denman ...................... 428/328 |
| 6,338,900 | B1 | * | 1/2002 | Tada et al. .................... 428/402 |
| 6,350,951 | B1 | * | 2/2002 | Askew ................ H01L 23/3135 174/391 |
| 6,695,985 | B2 | * | 2/2004 | Igarashi et al. ............ 252/518.1 |
| 6,800,804 | B2 | * | 10/2004 | Igarashi et al. ............... 174/391 |

(Continued)

*Primary Examiner* — Chau N Nguyen
*Assistant Examiner* — Roshn Varghese
(74) *Attorney, Agent, or Firm* — Angel N. Gerdzhikov; Donna P. Suchy; Daniel M. Barbieri

(57) ABSTRACT

An electromagnetic interference (EMI) shielded device and a method for making an EMI shield device are disclosed. The EMI shielded device may include an electrical circuit and an encapsulation layer disposed on a portion of the electrical circuit. The encapsulant layer having a plurality of particles dispersed therein, wherein the plurality of particles are suitable for shielding electrical circuitry from EMI. The method for making an EMI shielded device may include providing an electrical circuit, and depositing an encapsulant material upon a portion of the electrical circuit, wherein a plurality of EMI shielding particles are dispersed within the encapsulant material. An additional method may include depositing a dielectric material upon a portion of the electrical circuit and depositing an encapsulant material upon a portion of the dielectric material and the portion of the electrical circuit, wherein a plurality of EMI shielding particles are dispersed within the encapsulant material.

17 Claims, 12 Drawing Sheets

(56) References Cited

U.S. PATENT DOCUMENTS

| | | |
|---|---|---|
| 6,987,058 B2 * | 1/2006 | Hall ............... H01L 21/56 174/390 |
| 7,196,275 B2 * | 3/2007 | Babb et al. ............... 174/382 |
| 7,803,457 B2 * | 9/2010 | Irwin et al. ............... 428/323 |
| 8,263,224 B2 * | 9/2012 | Tokiwa ............... 428/407 |
| 2003/0155987 A1 * | 8/2003 | Kolb ............... H04B 15/02 333/12 |
| 2004/0026100 A1 * | 2/2004 | Mattson et al. ......... 174/35 MS |
| 2004/0056277 A1 * | 3/2004 | Karnezos ............... 257/200 |
| 2004/0126547 A1 * | 7/2004 | Coomer ............ H01L 21/4857 174/258 |
| 2004/0134682 A1 * | 7/2004 | En ............... C23C 18/1607 174/258 |
| 2005/0140539 A1 * | 6/2005 | Fujieda et al. ............... 342/1 |
| 2006/0152913 A1 * | 7/2006 | Richey ............... H05K 1/0218 361/818 |
| 2007/0252771 A1 * | 11/2007 | Maezawa et al. ............ 361/818 |
| 2008/0067650 A1 * | 3/2008 | Sham et al. ............... 257/678 |
| 2008/0283290 A1 * | 11/2008 | Niino ............... H05K 9/0001 174/350 |
| 2008/0315377 A1 * | 12/2008 | Eichelberger et al. ....... 257/660 |
| 2009/0002972 A1 * | 1/2009 | Carey et al. ............... 361/818 |
| 2009/0078458 A1 * | 3/2009 | Araumi ............... C08K 3/22 174/262 |
| 2009/0244878 A1 * | 10/2009 | Wurzel ............... H01L 23/552 361/818 |
| 2009/0302263 A1 * | 12/2009 | Dhawan et al. ............ 252/62.54 |
| 2010/0139971 A1 * | 6/2010 | Kato et al. ............... 174/388 |

* cited by examiner

— 1 —

SHIELDING ENCAPSULATION FOR ELECTRICAL CIRCUITRY

TECHNICAL FIELD

The present invention generally relates to electrical circuits, and more particularly to an electromagnetic interference shielded electrical circuit device and a method for making an electromagnetic shielded electrical circuit device.

BACKGROUND

It is often desirable to provide electromagnetic interference (EMI) shielding for electrical components of an electrical circuit. Electromagnetic interference shielding may be used to isolate EMI from external sources and from other components of the same electrical circuit or the same electrical device. One type of EMI shielding includes a metal plate mounted on the surface of an electrical circuit.

SUMMARY

An electromagnetic interference shielded device is disclosed. In one aspect, the electromagnetic shielded device may include, but is not limited to, an electrical circuit, an encapsulant layer disposed on at least a portion of the electrical circuit, and a plurality of particles dispersed within the encapsulant layer, wherein some of the plurality of particles are suitable for shielding electrical circuitry from electromagnetic interference.

A method for making an electromagnetic interference shielded device is disclosed. In one aspect, a method for making an electromagnetic interference device may include, but is not limited to, providing an electrical circuit, and depositing an encapsulant material upon at least a portion of the electrical circuit, wherein a plurality of particles are dispersed within the encapsulant material, wherein some of the plurality of particles are suitable for shielding electrical circuitry from electromagnetic interference. In another aspect, a method for making an electromagnetic interference device may include, but is not limited to, providing an electrical circuit, depositing a dielectric material upon at least a portion of the electrical circuit, and depositing an encapsulant material upon at least a portion of the dielectric material and the at least a portion of the electrical circuit, wherein a plurality of particles are dispersed within the encapsulant material, wherein some of the plurality of particles are suitable for shielding electrical circuitry from electromagnetic interference.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 3 1A is a partial cross-sectional view of a volume of EMI shielding material prior to deposition onto an electrical circuit, in accordance with one embodiment of the present invention.

DETAILED DESCRIPTION OF THE INVENTION

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

Referring generally to FIG. 1A through 5, an electromagnetic interference (EMI) shielded device 100 is described in accordance with the present disclosure. EMI shielding of electrical circuits may be an important feature in the construction and operation of electrical devices. Mechanical limitations may be greatly reduced by incorporating the EMI shielding function into an encapsulant material which also serves to protect the underlying circuitry from mechanical, chemical, and moisture damage.

Figure 1A:
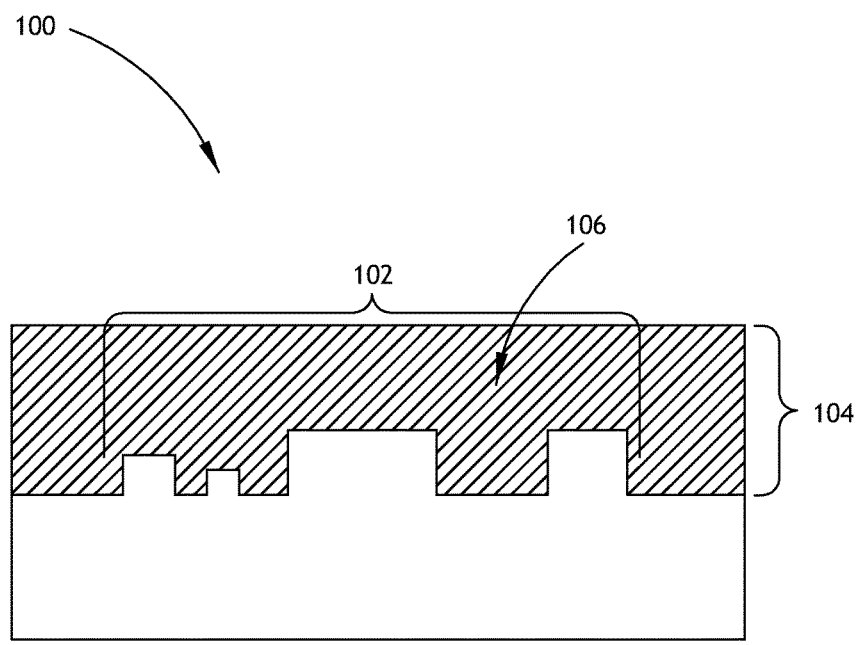
FIG. 1A is a cross-sectional view of an EMI shielded device, in accordance with one embodiment of the present invention.
Figure 1B:
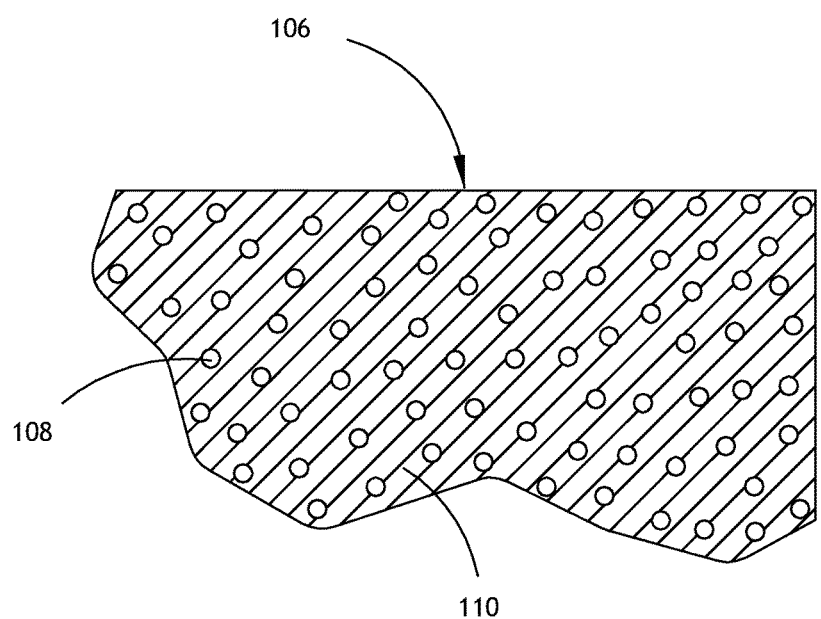
FIG. 1B is an enlarged cross-sectional view of an EMI shielding layer of an EMI shielded device, in accordance with one embodiment of the present invention.

FIGS. 1A and 1B illustrate a cross-sectional view of an EMI shielded device 100 in accordance with an exemplary embodiment of the present invention. The EMI shielded device 100 may include an electrical circuit 102 (e.g., an integrated circuit) and a conforming layer 104 of an EMI shielding composite material 106 deposited on the surface of the electrical circuit 102. The EMI shielding composite material 106 may include a selected amount of a particulate material 108 (e.g., ferrite particles), suitable for shielding electrical circuitry 102 from EMI, dispersed within the volume of an encapsulant material 110 (e.g., polymeric epoxy), suitable for deposition onto an electrical circuit 102.

Figure 2A:
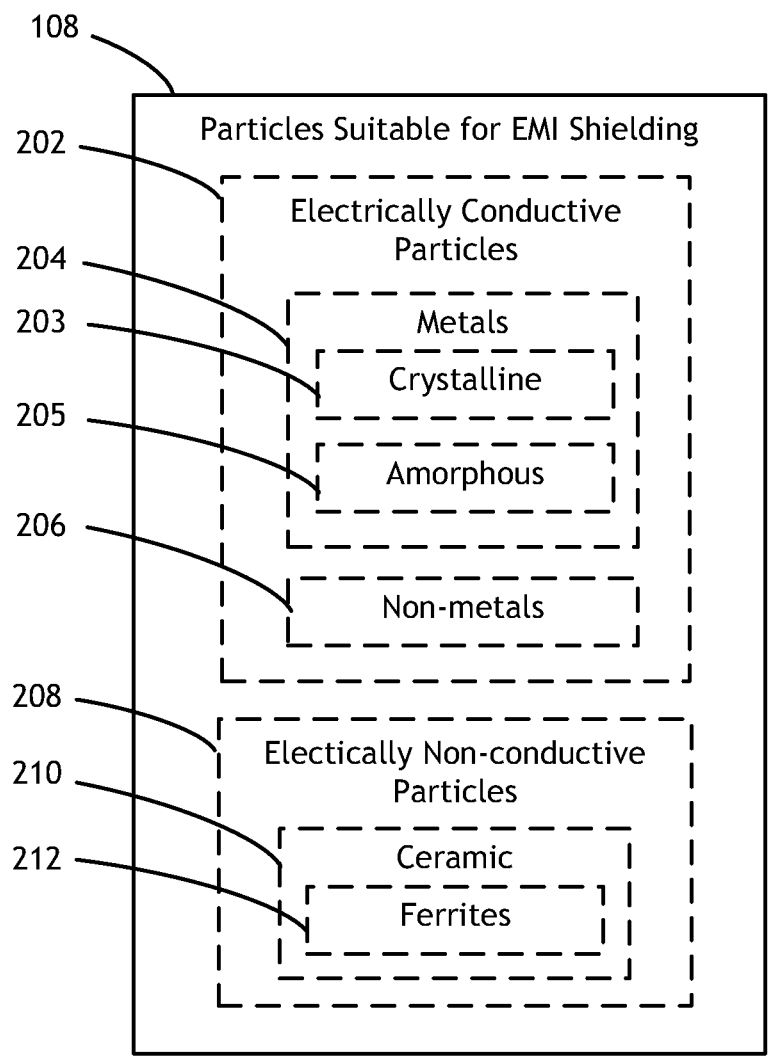
FIG. 2A is a block diagram listing types of particles suitable for implementation in the EMI shielded device, in accordance with one embodiment of the present invention.

Referring now to FIG. 2A, the particulate material 108 dispersed within the encapsulant material 110 may include electrically conductive particles 202. For example, the particulate material 108 may include, but is not limited to, metallic particles 204. For instance, the particulate material 108 may include, but is not limited to, a metallic material containing one or more crystalline metallic materials 203 or a metallic material containing one or more amorphous metallic materials 205.

For example, the electrically conductive particles 202 may include particles fabricated from one or more crystalline metallic materials 203 such as crystalline copper, crystalline aluminum, crystalline nickel, crystalline gold, or crystalline silver. For instance, a selected quantity of crystalline nickel particles may be dispersed within a selected amount of a given encapsulant material 110. This nickel based EMI shielding material 106 may then be deposited onto a portion of an electrical circuit 102. It should be recognized that in addition to monatomic crystalline materials, a variety of crystalline metallic alloys or compounds are suitable for implementation in the particulate matter 110 of the EMI shield layer 104.

By way of a further example, the electrically conductive particles 202 may include particles fabricated from one or more amorphous metallic materials 205 such as an amorphous palladium alloy, an amorphous zirconium alloy, an amorphous lanthanum alloy, an amorphous titanium alloy, or an amorphous copper alloy. It should be noted that amorphous metals are commonly referred to as metallic glasses or glassy metals when formed through a rapid cooling process. For instance, a selected quantity of amorphous copper alloy based particles may be dispersed within a selected amount of a given encapsulant material 110. This amorphous copper alloy based EMI shielding material 106 may then be deposited onto a portion of an electrical circuit 102. It should be recognized that a variety of amorphous metallic alloys or compounds are suitable for implementation in the particulate matter 110 of the EMI shield layer 104.

In another embodiment, the particulate material 108 may include a non-metallic conducting particulate material 206. For instance, particles formed from conducting organic materials, such as conducting polymers (e.g., polyacetylene or organosilicon), may be dispersed within a selected encapsulant material 110. This conducting polymer based shielding material 206 may then be deposited onto a portion of an electrical circuit 102. It should be recognized that a variety of conducting organic materials are suitable for implementation in the particulate matter 110 of the EMI shield layer 104.

In additional embodiments, the particulate material 108 dispersed within the encapsulant material 110 may include non-conducting particles 208. For example, the particulate material 108 may include ceramic particles 210 such as particles formed from a ferrite material 212. For instance, a selected quantity of a fully sintered soft ferrite powder (e.g., NiMn ferrite powder, MgZn ferrite powder, MnZn ferrite powder, or the like) may be dispersed within an encapsulant material 110. The ferrite 212 based EMI shielding material 106 may then be deposited onto a portion of an electrical circuit 102. It should be recognized that in the case of ferrites and similar particles the dispersed particles 108 absorb the impinging EM radiation (e.g., radio frequency radiation) and dissipate the associated energy as heat. In the case of NiMn based particles, the applicants have found that the amount of heat generated is minimal and below a detectable level. It should be appreciated that the elemental makeup and the crystalline structure of the material used as a dispersed particulate material 108 may impact the amount of EM radiation absorbed.

It should be recognized by those skilled in the art that use of non-conducting shielding particles is particularly advantageous as it minimizes the risk of short circuit malfunctions within the underlying electrical circuitry 102. It is further recognized that the choice of material may depend on the characteristics of the underlying circuitry and the physical limitations placed on the EMI shield layer 104. For instance, in the case of low loss ceramics, the skin depth of the impinging RF radiation is approximated by:

$$\delta \cong \left(\frac{2}{\omega \varepsilon''}\right)\sqrt{\frac{\varepsilon'}{\mu \varepsilon_o}} \qquad \text{(Eqn. 1)}$$

where $\varepsilon'$ and $\varepsilon''$ represent the real and imaginary part of the dielectric permittivity of the EMI shielding layer 104 respectively, $\mu$ represents the magnetic permeability of the EMI shielding layer 104, and $\omega$ represents the frequency of the electromagnetic radiation (e.g., radiofrequency radiation or microwave radiation) impinging on the EMI shield layer 104. Therefore, different ceramic materials, having different dielectric permittivity and magnetic permeability characteristics, may be implemented in different contexts in order to accommodate the requirements of the underlying circuitry 102 (e.g., frequency sensitivity requirements) and the requirements of the EMI shield layer 104 (e.g., mechanical thickness requirements).

In some embodiments, the size of the particles 108 dispersed within the encapsulant material 110 may exist within a selected size range. For example, the range of particle 108 size within a given particulate material dispersed within the encapsulant material 110 may be selected in order to achieve a desired impact on electromagnetic radiation impinging on the EMI shielding layer 104. For instance, the size of the utilized particles 108 may impact the attenuation of incident electromagnetic radiation in the EMI shielding material, and, as a result, the skin depth of the radiation may depend on the size of the utilized particles. It is further recognized that the size of the utilized particles may dictate the electromagnetic frequencies transmittable through the EMI shielding layer 104 (or conversely the RF frequencies filtered by the EMI shielding layer 104). The applicants have shown that a particulate ferrite material having an average particle size between 200 and 500 μm dispersed within an encapsulant material 110 displays radiofrequency absorption properties suitable for implementation in the EMI shielding layer 104 of the present invention.

In additional embodiments, the concentration of the particles 108 dispersed within the encapsulant material 110 may be selected in order to achieve a desired impact on electromagnetic radiation impinging on the EMI shielding layer 104. For instance, the concentration of particles 108 dispersed within the encapsulant material 110 may impact the attenuation (i.e., the skin depth) of incident electromagnetic radiation in the EMI shield material. It is further contemplated that the frequency of radiation transmitted through the EMI shielding layer will depend on the particle-encapsulant concentration level. Therefore, the electromagnetic properties of the shielding layer 104 may be tuned by adjusting the particle-encapsulant concentration level. Applicants have shown that a ferrite-epoxy composite having a concentration of up to 85% by weight displays both the electromagnetic and mechanical properties necessary for utilization in the EMI shielding layer 104 disclosed in the present invention.

Figure 2B:
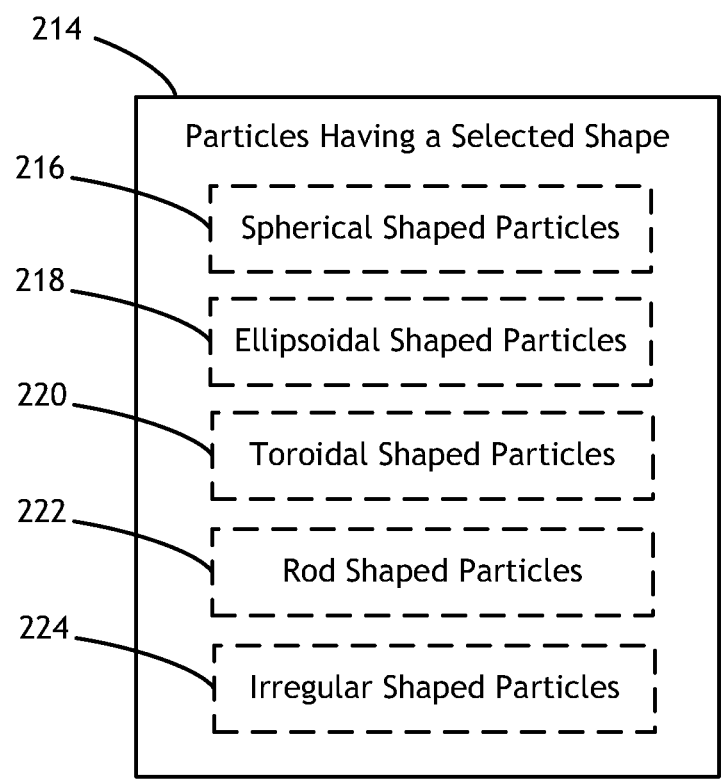
FIG. 2B is block diagram listing shapes of particles suitable for implementation in the EMI shielded device, in accordance with one embodiment of the present invention.

Referring now to FIG. 2B, the particulate material 108 dispersed within the encapsulant material 110 may include particles having a selected shape 214. For example, the shape of particles dispersed within the encapsulant material 110 may include a sphere 216, an ellipsoid 218, a toroid 220, a rod 222 or an irregular shape 224. For instance, the particles dispersed within the encapsulant material 110 may have a rod shape 222. In another instance, the particles 108 dispersed within the encapsulant material 110 may include particles having an irregular shape 224. It should be appreciated that the specific shape of particles within a particulate material 108 dispersed within an encapsulant material may impact the amount of impinging EM radiation absorbed by the particulate material 108. Applicants have shown that spherically shaped 216 ferrite particles dispersed within an encapsulant material 110 display RF absorption properties suitable for implementation in the EMI shielding layer 104 of the present invention. It should be recognized that there is no generalized limitation on the shape of particles implemented in accordance with the present invention and the preceding description merely represents an illustration.

Figure 2C:
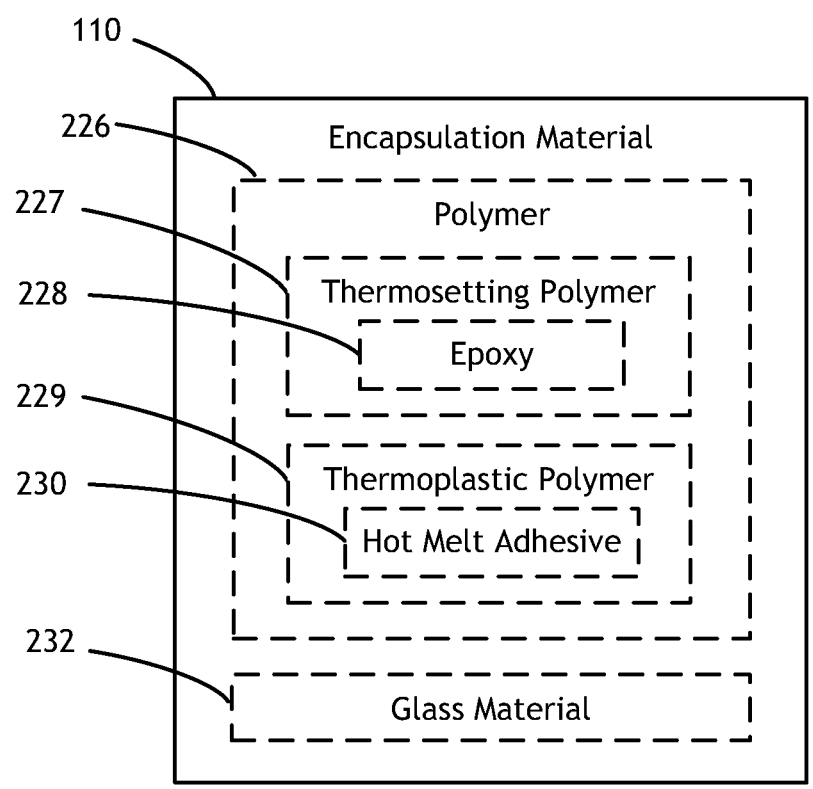
FIG. 2C is a block diagram listing types of encapsulation material suitable for implementation in the EMI shielded device, in accordance with one embodiment of the present invention.

Referring now to FIG. 2C, the encapsulation material 110 disposed on the surface of the electrical circuit 102 may include a polymer 226 based material. For example, the encapsulation material 110 may include a thermosetting polymer 227. For instance, a suitable thermosetting polymer 227 for use in the EMI shielding layer 104 may include, but is not limited to, a polyimide polymer. It should be noted, however, that depending on the specific polyimide formulation, a polyimide polymer may also display thermoplastic behavior.

In another instance, a thermosetting polymer 227 may include, but is not limited to, an epoxy 228, such as an epoxy resin that may be cured via thermal treatment, an epoxy resin that may be cured via chemical reaction, or an epoxy resin that may be cured via irradiation exposure. A suitable epoxy resin may include an epoxy resin from the biphenol A diglycidyl ether (BADGE) family of epoxy resins. The applicants have shown that an electronics grade anhydride cured diglycidyl ether of bisphenol A epoxy displays electromagnetic and mechanical properties suitable for implementation in the EMI shield layer 104 of the present invention.

By way of another example, the encapsulation material 110 may include a thermoplastic polymer 228. For instance, a suitable thermoplastic polymer for use in the EMI shielding layer 104 may include, but is not limited to, polyurethane, poly(methyl methacrylate), (i.e., acrylic) or polycarbonate. Further, the encapsulation material 110 may include, but is not limited to, a silicone polymer or a fluorocarbon polymer. For instance, the encapsulation material 110 may include a polyorganosiloxane polymer. Further, the encapsulation material 110 may include a silicone resin that may undergo a curing process after deposition resulting in a hardened crosslinked polysiloxane network. In another instance, the encapsulation material 110 may include a fluorocarbon such as polytetrafluoroethylene (i.e., Teflon).

It should be recognized that there is no generalized limitation on the type of polymer encapsulation material 110 implemented in accordance with the present invention and the preceding list of polymer materials merely represents an illustration of polymeric encapsulation materials 226.

Moreover, the encapsulation material 110 disposed on the surface of the electrical circuit 102 may include a glass 236. For example, the encapsulation material 110 may include a silicon dioxide based glass. It is recognized that a number of alternative polymeric and glass encapsulation materials 110, in accordance with the present invention, may be suitable in different contexts, wherein thermal, mechanical, and moisture protection requirements of the device 100 may dictate the choice of encapsulation material 110.

Figure 3:
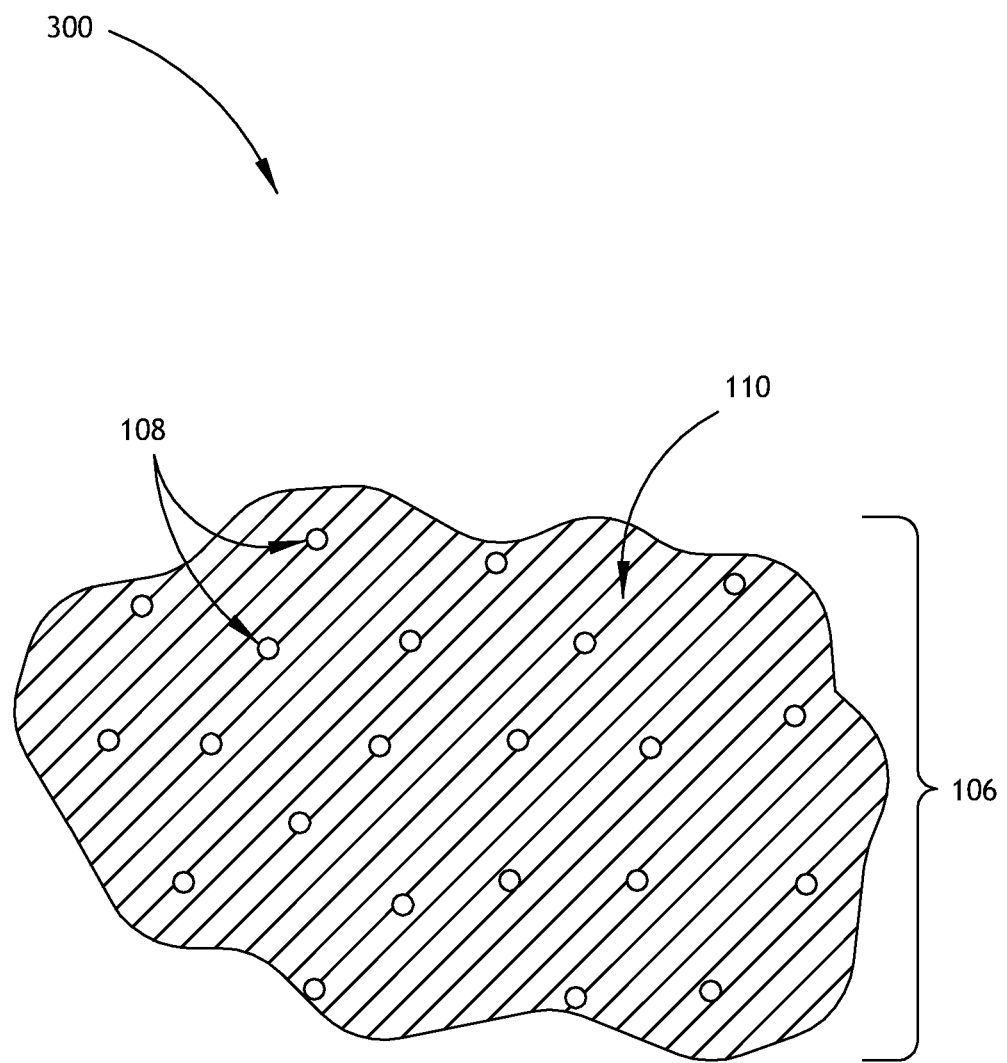

Referring now to FIG. 3, a volume 300 of liquefied EMI shielding material 106 may be prepared for deposition onto the surface of an electrical circuit 102 by loading a selected amount of a particulate material (e.g., ferrite particles) suitable for shielding electrical circuitry 102 from EMI into a selected amount of liquid encapsulant material 110 (e.g., polymeric epoxy), where the encapsulant material 110 is suitable for coating one or more components of an electrical circuit 102. The liquid EMI shielding material 106, consisting of the particulate material 108 dispersed within the encapsulant material 110, may then be deposited onto the surface of the electrical circuit 102.

In some embodiments, the preloaded liquefied EMI shielding material 106 may be deposited onto the surface of an electrical circuit 102 utilizing a casting process. For example, the liquefied volume 300 of encapsulant material 110 and the particles contained therein may be poured onto the surface of an electrical circuit 102. The liquefied EMI shielding material 106 is then allowed to self-level and solidify, resulting in a solid EMI shielding layer 104 as illustrated in FIG. 1. Further, the preloaded liquefied EMI shielding material 106 may be deposited onto the surface of an electrical circuit 102 utilizing a casting process, wherein a portion of the electrical circuit is bounded by a retaining container configured to retain the liquefied EMI shielding material 106. The liquefied EMI shielding material 106 may then be poured into the retaining container and allowed to solidify. In configurations wherein the retaining container remains attached to the device 100, the process is commonly referred to as a "potting" process.

In some embodiments, the preloaded liquefied EMI shielding material 106 may be deposited onto the surface of an electrical circuit 102 utilizing a molding process. For example, the liquefied volume 300 of encapsulant material 110 and the particles contained therein may be poured into a mold operably coupled to the electrical circuit 102. The liquefied EMI shielding material 106 is then poured into the mold and allowed and solidify, resulting in a solid EMI shielding layer 104 similar to that illustrated in FIG. 1.

In a further embodiment, the preloaded liquefied EMI shielding material 106 may be deposited onto the surface of an electrical circuit 102 utilizing a low pressure injection molding process. For example, a volume 300 of a molten thermoplastic polymer 229 (e.g., polyurethane or polyethylene) and the particles 108 contained therein may be injected into a mold operably connected to an electrical circuit 102. The molten thermoplastic 229 may then be allowed to cool, resulting in a solid EMI shielding layer 104 similar to that illustrated in FIG. 1. In another example a thermosetting polymer 227 (e.g., epoxy resin) and the particles 108 contained therein may be injected (e.g., via a liquid injection method or a reaction injection method) into a mold operably connected to an electrical circuit 102. The thermosetting polymer 227 may then be allowed to cure or harden, resulting in a solid EMI shielding layer 104 similar to that illustrated in FIG. 1.

In additional embodiments, the deposited EMI shielding layer 104 may further undergo a curing process. For example, the material used in the encapsulant layer may be chosen so as to be susceptible to chemical, radiation, or thermal curing. For example, the liquefied volume 300 of encapsulant material 110 sensitive to UV radiation and the particles contained therein may be poured onto the surface of an electrical circuit 102. The liquefied EMI shielding material 106 may then be treated with ultraviolet radiation until the liquid EMI shielding material 106 hardens into an EMI shielding layer 104.

Figure 4:
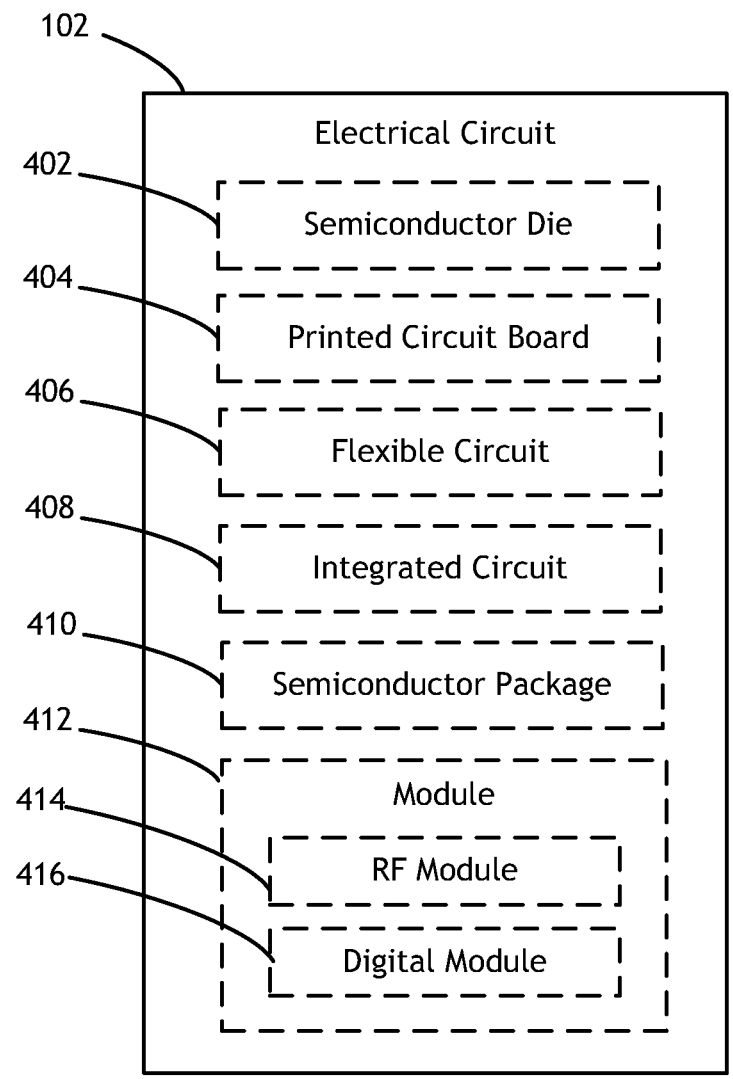
FIG. 4 is block diagram listing types of electrical circuitry suitable for implementation in the EMI shielded device, in accordance with one embodiment of the present invention.

Referring now to FIG. 4, the electrical circuit 102 may include a semiconductor die 402 prior to dicing. For example, the liquefied EMI shielding material 106 may be poured onto the surface of a semiconductor die 402 prior to dicing. The liquefied EMI shielding material 106 may then be allowed to self-level and solidify prior before dicing.

In other embodiments, the electrical circuit 102 may include a printed circuit board (PCB) 404. For example, the liquefied EMI shielding material 106 may be poured onto the entire surface of a printed circuit board (PCB) 404. The liquefied material EMI shielding material 106 may then be allowed to self-level and solidify. Alternatively, the liquefied EMI shielding material 106 may be deposited on a subsection of a PCB 404 implementing the casting or molding processes described herein. The liquefied material EMI shielding material 106 may then be allowed to self-level and solidify.

In additional embodiments, the electrical circuit 102 may include a flexible circuit 406, an integrated circuit 408 or a semiconductor package 410. For example, the liquefied EMI shielding material 106 may be poured onto the entire surface of a flexible circuit 406, an integrated circuit 408 or a semiconductor package 410. The liquefied material EMI shielding material 106 may then be allowed to self-level and solidify.

In other embodiments, the liquefied EMI shielding material 106 may be used to shield modules 412 in a mixed signal type application. For example, the liquefied EMI shielding material 106 may be used to individually shield components, such as an RF module 414 or a digital module 416. It will be recognized that while the EMI shielding layer 104 may be utilized to shield circuitry 102, such as an RF Module 414, from external sources of EMI interference (e.g., RF interference) a large amount of interference that impacts the RF section in a mixed signal application is caused by the digital module 416. Therefore, for example, the liquid EMI shielding material 106 may be used to shield the RF module 414 from interference from the digital module 416 by coating a portion of the RF module 414 with the liquid EMI shielding material 106. By way of another example, the liquid EMI shielding material 106 may be used to shield the RF module 414 from interference from the digital module 416 by coating a portion of the digital module 416 with the liquid EMI shielding material 106.

It is further contemplated that the particulate material (e.g., ferrite particles) suitable for shielding electrical circuitry 102 from electromagnetic interference may be doped into the encapsulant material 110 after the encapsulant material 110 has been deposited on a portion of an electrical circuit 102. For example, a liquefied encapsulant material 110 may be poured onto an electrical circuit 102. Then, after the encapsulant material 110 deposition, a particulate matter 108 suitable for absorbing electromagnetic radiation may be doped into the encapsulant layer 110. For instance, the particulate material 108 may be applied to the surface of the encapsulant material 110 while the encapsulant material is in a liquefied form, prior to curing or hardening. In the case of thermoplastics, it is further contemplated that an encapsulant material 110 may be deposited onto an electrical circuit 102 and allowed to harden. Then, a particulate material 108 may be deposited onto the surface of the encapsulant material and the circuit-encapsulant layer assembly may be heated allowing the thermoplastic to soften or even flow. It is recognized that the particulate material 108 will then diffuse into the encapsulant material 110 resulting in an EMI shield layer 104 in accordance with the present invention. It is further recognized that the doping method may lead to an anisotropic distribution of particles 108 within the encapsulant layer 104, with the particle concentration larger at the encapsulant-air interface than the encapsulant-circuit interface. This effect may be utilized to aid in short circuit malfunctions in the underling circuitry 102.

Referring now to FIGS. 5A-D, a conformal dielectric layer 105 may be deposited onto the surface of the electrical circuit 102 prior to the deposition of the encapsulant material 110. It is recognized that a dielectric layer 105 interposed between the EMI shielding layer 104 and the electrical circuit 102 may provide short circuit protection, mechanical protection, and protection from moisture and other contaminants to the underlying electrical circuit 102. An interposed dielectric layer 105 is particularly useful when the particles 108 dispersed within the overlying encapsulant material 110 include conducting particles, as the dielectric layer 105 acts to provide a conformal insulating layer between components of the underlying circuitry 102. In some embodiments, the dielectric layer may include a polymer, such as an epoxy, polyimide, polyurethane, acrylic, silicone, polyethylene or polytetrafluoroethylene (i.e., Teflon). It is recognized that the conformal dielectric layer may include the same material as the encapsulant material 110 used in the subsequently deposited EMI shielding layer 104. It should be recognized that there is no generalized limitation on the type of conformal dielectric material implemented in accordance with the present invention and the preceding list of polymer materials merely represents an illustration of dielectric insulating layers. It should be appreciated that a number of alternative polymeric materials, in accordance with the present invention, may be suitable in different various contexts, wherein the thermal, mechanical, and moisture protection requirements of the device 100 may dictate the choice of the conformal dielectric layer 105.

Moreover, the conformal dielectric layer 105 may be deposited through a variety of industry recognized process. For example, the conformal dielectric layer 105 may be deposited using a casting process, a spraying process, or a dipping process. For instance, a selected dielectric layer material (e.g., polyurethane) may be dissolved in an appropriate solvent in order to form a dilute solution. The dilute solution of dielectric material may then be sprayed, dipped, or cast onto the surface of an electrical circuit.

In a further embodiment, the dielectric layer may include a dielectric layer having a selected thickness. For example, the dielectric layer may be deposited such that its thickness, when measured along the electrical circuit surface normal, is selected for purposes of circuit functionality. For instance, a threshold thickness may be selected in order to maintain a minimum level of resistance between circuit components or conductive shield particles 108. In another instance, a threshold thickness may be chose to provide adequate mechanical or moisture protection to the underlying circuitry. In contrast, the conforming dielectric layer 105 may be chosen thin enough to allow the subsequent EMI shield layer 104 the ability to intersperse between adjacent electrical circuit components, thus providing adequate EMI shielding between adjacent components.

Figure 6:
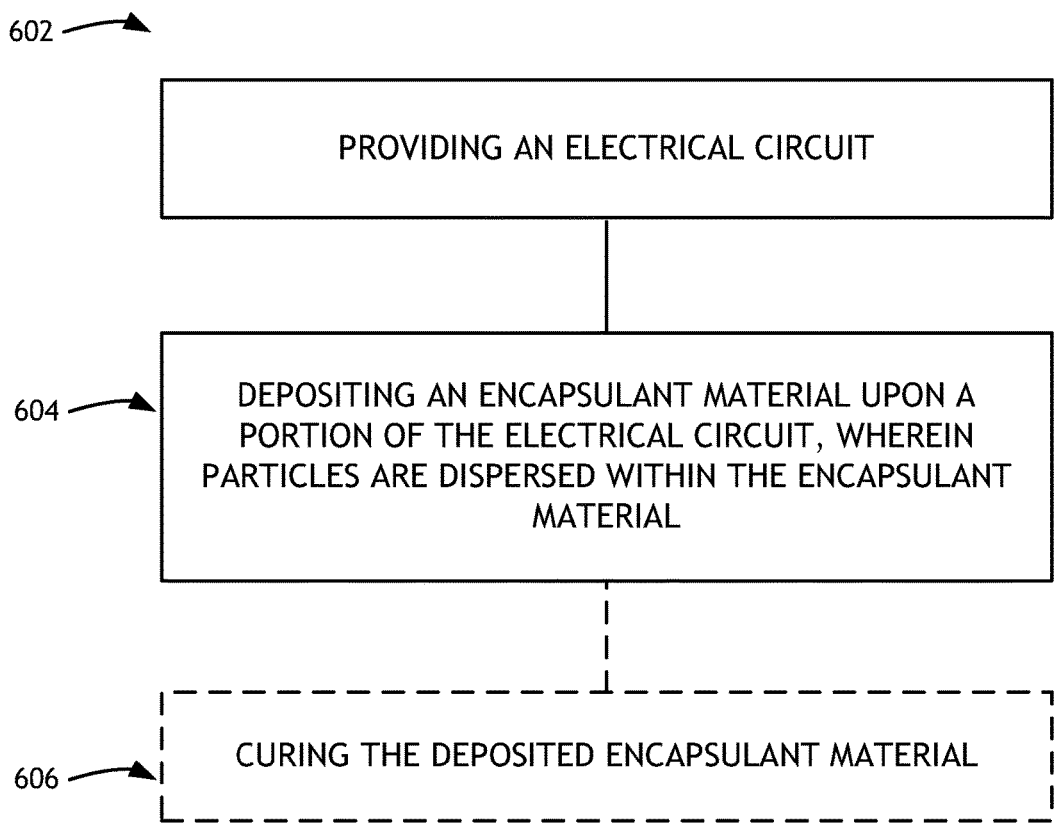
FIG. 6 is a flow chart illustrating a method for making an EMI shielded device.

Referring now to FIG. 6, a method 600 for making an EMI shielded device 100 is described in accordance with the present disclosure. The method 600 for making an EMI shielded device 100 includes providing 602 an electrical circuit 102. Then, the method 600 includes depositing 604 an encapsulant material 110 upon at least a portion of the electrical circuit 102. For example, an encapsulant layer may be deposited onto the surface of an electrical circuit via a casting or molding process. Here, a plurality of particles 108 are dispersed within the encapsulant material 110, wherein some of the particles 108 are suitable for shielding electrical circuitry from electromagnetic interference. For instance, the particle may include conducting particles (e.g., crystalline metals or amorphous metals) of non-conductive particles, such as ceramics (e.g., ferrite materials). In some instances, the method 600 may include curing 606 (e.g., thermal curing, chemical curing, or radiation curing) the deposited encapsulant material 110.

Figure 5A:
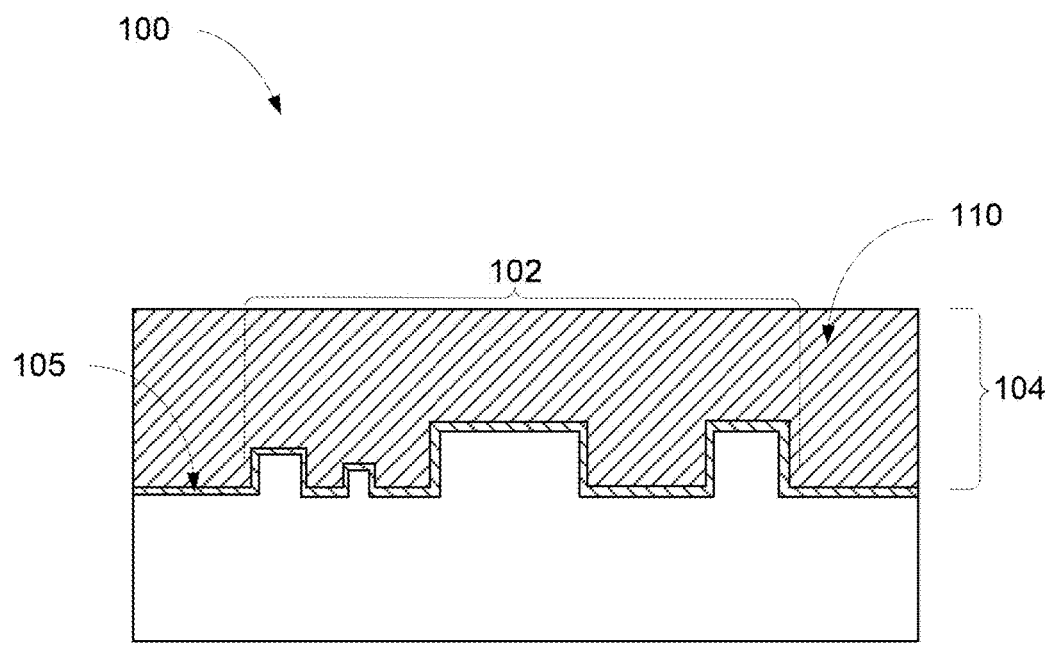
FIGS. 5A-D are cross-sectional views of EMI shielded devices with an interposed dielectric layer between the EMI shielding material and the underlying circuitry, in accordance with embodiments of the present invention.
Figure 5B:
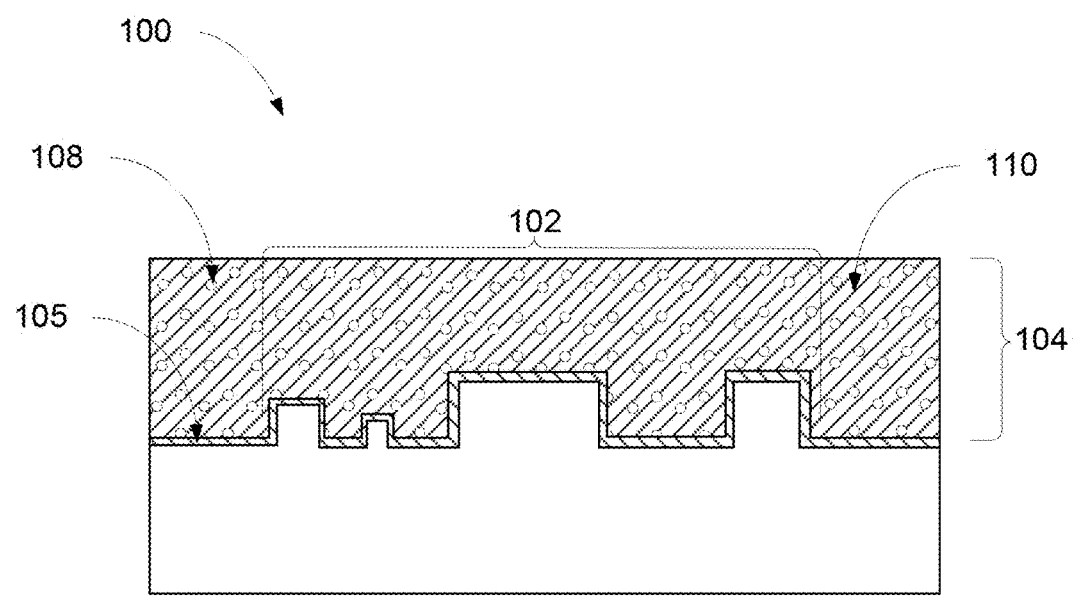
Figure 5C:
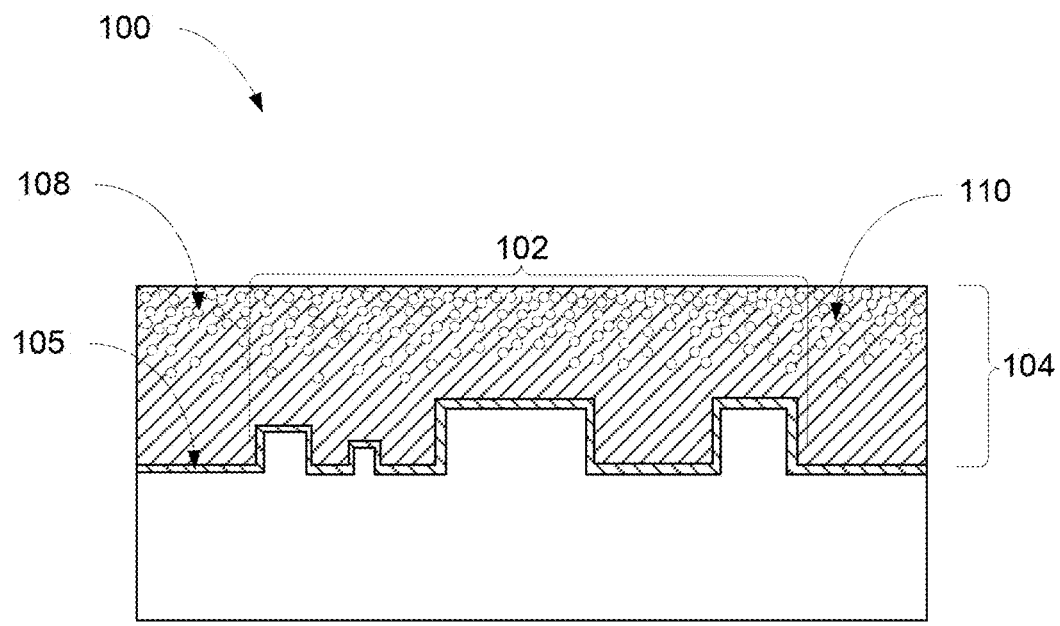
Figure 5D:
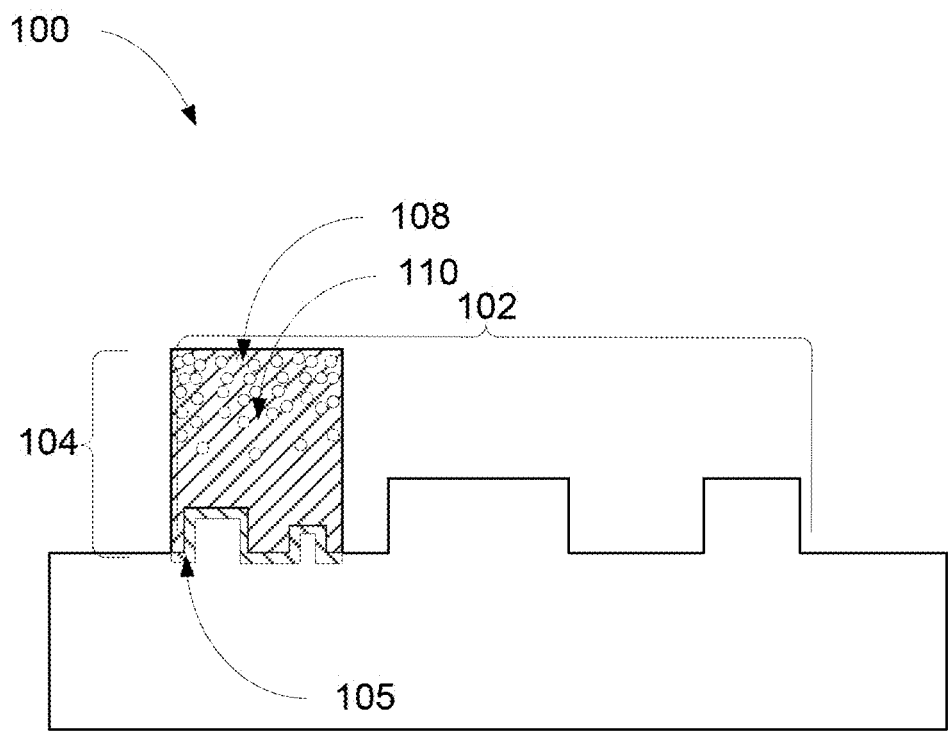
Figure 7:
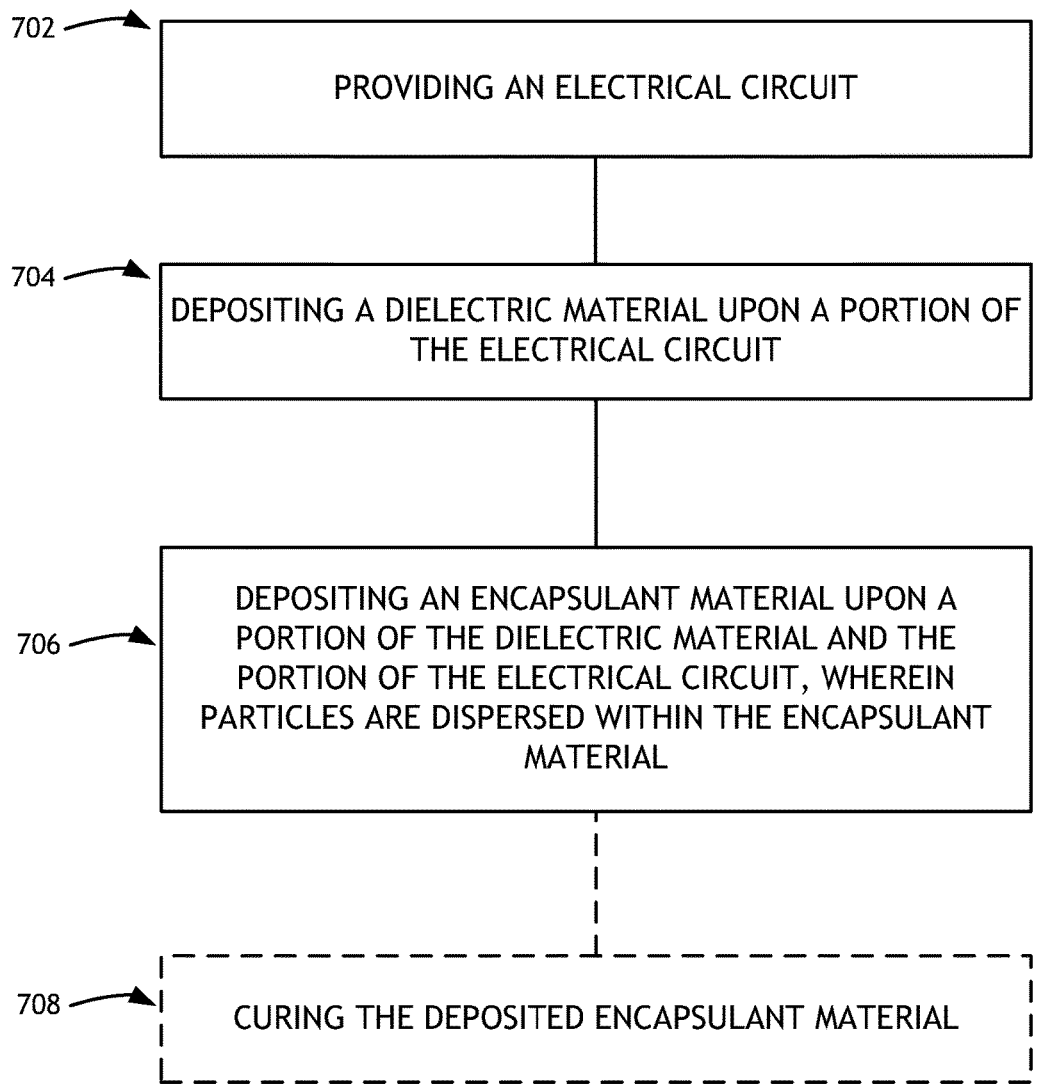
FIG. 7 is a flow chart illustrating a method for making an EMI shielded device.

Referring now to FIG. 7, a method 700 for making an EMI shielded device 100 is described in accordance with the present disclosure. The method 700 for making an EMI shielded device 100 includes providing 702 an electrical circuit. Then, the method 700 includes depositing 704 a dielectric layer 105 upon at least a portion of the electrical circuit 102 as depicted in FIG. 5D. For example, a dielectric material (e.g., polyurethane) may be applied to a surface of the electrical circuit via a dipping, spraying, or casting process. Next, the method 700 includes depositing 706 an encapsulant material 110 upon at least a portion of the electrical circuit 102. For example, an encapsulant layer may be deposited onto the surface of the dielectric coated electrical circuit via a casting or molding process. Here, a plurality of particles 108 are dispersed within the encapsulant material 110, wherein some of the particles 108 are suitable for shielding electrical circuitry from electromagnetic interference. For instance, the particle may include conducting particles (e.g., crystalline metals or amorphous metals) of non-conductive particles, such as ceramics (e.g., ferrite materials). In some instances, the method 700 may include curing 708 (e.g., thermal curing, chemical curing, or radiation curing) the deposited encapsulant material 110.

While the preceding description has described an EMI shielded device 100 and methods 600 and 700 for making an EMI shielded device in the context of shielding electrical components from harmful EMI interference, it is further contemplated that the described EMI shielded device 100 may be constructed in order to shield the electrical circuitry 102 from emanating security compromising emissions. For example, an EMI shield layer 104 may be used to absorb information bearing emissions (e.g., EM radiation, magnetic fields, or electric fields) emanating from underlying electrical circuitry 102. For instance, electrical circuitry 102 may transmit, receive, or process information. The information or indicia of the information may unintentionally emanate from the electrical circuit 102 device in the form of EM radiation, electric fields or magnetic fields. By coating the electrical circuit 102 device or a portion thereof with the EMI shielding material 106, the EM radiation, electrical fields, or magnetic fields which would otherwise emanate from the electrical circuit device 102 may be absorbed or partially absorbed by the EMI shielding material 106. Due to the flexibility and ease of deposition of the disclosed EMI shielding material 106 it provides a superior method of shielding various electrical circuits 102 and electrical device components.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. An electromagnetic interference shielded device, comprising:
    an electrical circuit comprising a radio frequency module or a digital module;
    a conforming dielectric layer disposed on at least a portion of the electrical circuit;
    an electrically non-conductive encapsulant layer disposed on at least a portion of the dielectric layer and disposed on the radio frequency module or the digital module of the electrical circuit, the dielectric layer being between the electrical circuit and the electrically non-conductive encapsulant layer, the electrically non-conductive encapsulant layer comprising a substantially planar encapsulant-air interface and an encapsulant-dielectric interface, the encapsulant-air interface extending across the electrically non-conductive encapsulant layer; and
    a plurality of particles anisotropically dispersed within the electrically non-conductive encapsulant layer such that a particle concentration along the substantially planar encapsulant-air interface is higher than a particle concentration along the encapsulant-dielectric interface, the plurality of particles comprising a Nickel-Manganese (NiMn) ferrite material or polyacetylene,
    wherein the particle concentration at the encapsulant-air interface is sufficiently high to provide electromagnetic interference protection to the electrical circuit and the particle concentration at the encapsulant-dielectric interface is sufficiently low to provide short-circuit protection of the electrical circuit along the encapsulant-dielectric interface.

2. The electromagnetic interference shielded device of claim 1, wherein the electrically non-conductive encapsulant layer comprises a thermosetting polymer, the thermosetting polymer comprising an epoxy resin, the epoxy resin comprising a biphenol A diglycidyl ether (BADGE) resin.

3. The electromagnetic interference shielded device of claim 1, wherein the plurality of particles comprises:
    a plurality of particles having a selected size distribution, wherein the average size of the particles is between 200 and 500 μm.

4. The electromagnetic interference shielded device of claim 1, wherein the plurality of particles comprises:
    electrically non-conductive particles having a spherical shape.

5. The electromagnetic interference shielded device of claim 1, wherein the conformal dielectric layer has a selected thickness.

6. The electromagnetic interference shielded device of claim 5, wherein the selected thickness is thin enough to allow the electrically non-conductive encapsulant layer an ability to intersperse between adjacent electrical circuit components.

7. The electromagnetic interference shielded device of claim 1, wherein the plurality of particles are dopant particles comprising the Nickel-Manganese (NiMn) ferrite material.

8. The electromagnetic interference shielded device of claim 1, wherein the electrical circuit comprises the digital module, wherein the dielectric layer is disposed on the digital module, and wherein the electrically non-conductive encapsulant layer is disposed on a portion of the dielectric layer conforming to the digital module.

9. An electromagnetic interference shielded device, comprising:
 electrical circuitry including at least a radio-frequency module;
 an electrically non-conductive polymer-based encapsulant layer including an encapsulant-air interface, wherein the electrically non-conductive polymer-based encapsulant layer coats substantially only the radio-frequency module of the electrical circuitry;
 a conformal dielectric layer between the electrically non-conductive polymer-based encapsulant layer and the electrical circuitry; and
 a plurality of particles anisotropically dispersed within the electrically non-conductive polymer-based encapsulant layer such that a particle concentration along the encapsulant-air interface is higher than a particle concentration along an encapsulant-dielectric interface, the plurality of particles comprising a Nickel-Manganese (NiMn) ferrite material or polyacetylene,
 wherein the particle concentration at the encapsulant-air interface is sufficiently high to provide electromagnetic interference protection to the electrical circuitry, wherein the electrically conductive particle concentration at the encapsulant-dielectric interface is sufficiently low to provide short-circuit protection of the electrical circuitry along the encapsulate-dielectric interface.

10. The electromagnetic interference shielded device of claim 9, wherein the plurality of particles comprises polyacetylene particles.

11. The electromagnetic interference shielded device of claim 9, wherein the plurality of particles and the electrically non-conductive polymer-based encapsulant layer comprise a cast.

12. An electromagnetic interference shielded device, comprising:
 electrical circuitry comprising at least a radio-frequency module and a digital module;
 an electrically non-conductive encapsulant layer including a substantially planar encapsulant-air interface, wherein the electrically non-conductive encapsulant layer coats substantially only at least one of the radio-frequency module or the digital module of the electrical circuitry;
 a conformal dielectric layer between the electrically non-conductive encapsulant layer and the electrical circuitry; and
 a plurality of particles anisotropically dispersed within the electrically non-conductive encapsulant layer such that a particle concentration along the substantially planar encapsulant-air interface is higher than a particle concentration along an encapsulant-dielectric interface, the plurality of particles comprising a Nickel-Manganese (NiMn) ferrite material or polyacetylene,
 wherein the particle concentration at the encapsulant-air interface is sufficiently high to provide electromagnetic interference protection to the electrical circuitry, wherein the particle concentration at the encapsulant-dielectric interface is sufficiently low to provide short-circuit protection of the electrical circuitry along the encapsulate-dielectric interface from the plurality of particles.

13. The electromagnetic interference shielded device of claim 12, wherein the plurality of particles anisotropically dispersed within the electrically non-conductive encapsulant layer comprises:
 a plurality of dopant particles anisotropically dispersed within the electrically non-conductive encapsulant layer.

14. The electromagnetic interference shield device of claim 12, wherein the electrically non-conductive encapsulant layer is a liquefied electrically non-conductive encapsulant layer.

15. The electromagnetic interference shielded device of claim 14, wherein the liquefied electrically non-conductive encapsulant layer comprises a curable, polymer-based liquefied electrically non-conductive encapsulant layer.

16. The electromagnetic interference shielded device of claim 12, wherein the plurality of particles anisotropically dispersed comprises polyacetylene particles.

17. The electromagnetic interface shielded device of claim 12, wherein the plurality of particles anisotropically dispersed and the electrically non-conductive encapsulant layer comprise a cast.

\* \* \* \* \*